United States Patent [19]

Young

[11] 4,351,101

[45] Sep. 28, 1982

[54] SEMICONDUCTOR DEVICE PROCESSING FOR READILY AND RELIABLY FORMING ELECTRICAL INTERCONNECTS TO CONTACT PADS

[75] Inventor: Miriam F. Young, Dorchester, Mass.

[73] Assignee: Honeywell Inc., Minneapolis, Minn.

[21] Appl. No.: 198,319

[22] Filed: Oct. 20, 1980

[51] Int. Cl.³ ............................................. H01L 21/95
[52] U.S. Cl. .................................. 29/577 C; 29/581; 29/589
[58] Field of Search ................ 29/577 IC, 577 R, 581, 29/589

[56] References Cited

U.S. PATENT DOCUMENTS

| | | |
|---|---|---|
| 3,965,568 | 6/1976 | Gooch . |
| 4,113,578 | 9/1978 | Del Monte . |
| 4,137,625 | 2/1979 | White .............................. 29/577 C |
| 4,196,508 | 4/1980 | Lorenze, Jr. . |
| 4,197,633 | 4/1980 | Lorenze et al. .................. 29/577 R |
| 4,209,358 | 6/1980 | DiLeo ............................. 29/589 X |
| 4,233,103 | 11/1980 | Shaheen ........................... 29/589 X |

Primary Examiner—L. Dewayne Rutledge
Assistant Examiner—David Hey
Attorney, Agent, or Firm—John P. Sumner

[57] ABSTRACT

An improved method of providing a semiconductor device having a semiconductor substrate containing solid state signal processing circuitry. The solid state signal processing circuitry comprises doped regions of predetermined resistivity within the semiconductor substrate. A passivation layer covers a surface of the semiconductor substrate with electrical contacts to the solid state signal processing circuitry exposed through the passivation layer. The improvement comprises forming, on the electrical contacts, contact pads which have an upper surface devoid of a depressed center region. After the forming step, an adhering insulator material is deposited over the passivation layer, and a semiconductor wafer is mounted onto the substrate above the contact pads to form an assembly. The mounting process comprises applying pressure to the assembly and heating the assembly so that, prior to curing, adhering insulator material is squeezed out between the contact pads and a minimum thickness of adhering insulator material remains between the substrate and the wafer. The adhering insulator material is then allowed to cure. Portions of the wafer and adhering insulator material are then removed to expose the upper surface of predetermined contact pads. Predetermined regions of the remaining semiconductor wafer are then electrically interconnected with predetermined contact pads.

8 Claims, 16 Drawing Figures

SEMICONDUCTOR DEVICE PROCESSING FOR READILY AND RELIABLY FORMING ELECTRICAL INTERCONNECTS TO CONTACT PADS

The Government has rights in this invention pursuant to Contract No. DAAK70-78-C-0152 awarded by the Department of the Army.

BACKGROUND OF THE INVENTION

The present invention relates to a highly advantageous method of fabricating a semiconductor device so that the contact pads on an integrated circuit substrate within the device can be readily and reliably connected to predetermined regions of a semiconductor wafer mounted to the substrate. Although the invention is disclosed in the context of an IR/CCD focal plane structure, it is not limited to such devices.

U.S. Pat. No. 4,196,508, which is incorporated by reference herein, discloses fabrication of hybrid mosaic IR/CCD focal plane structures on a silicon substrate containing integrated circuit CCD signal processing circuitry. Each structure includes photodetectors which are interconnected to the signal processing circuitry with thin film electrical interconnects and contact pads.

Methods disclosed in the patent for obtaining access to the contact pads in order to make the thin film electrical interconnects have proven to be methods requiring a relatively high degree of skill and resulting in a relatively low yield of useable devices. In addition, the disclosed methods are primarily applicable to devices having a relatively low density of detectors, a typical device having 32 detectors coupled to 32 contact pads. This is in contrast to present interest in much higher density devices such as those including 1000 or more detectors, each individually coupled to its own contact pad.

Accordingly, the present invention provides for more readily and reliably obtaining high quality thin film electrical interconnects through processes compatible with relatively high volume production. As such, the present invention permits fabrication of devices which have much higher detector element packing densities than previously obtainable. At the same time, the present invention reduces the level of processing skill required and increases the yield of high quality devices.

SUMMARY OF THE INVENTION

The present invention is an improved method of providing a semiconductor device having a semiconductor substrate containing solid state signal processing circuitry. The solid state signal processing circuitry comprises doped regions of predetermined resistivity within the semiconductor substrate. A passivation layer covers a surface of the semiconductor substrate with electrical contacts to the solid state signal processing circuitry exposed through the passivation layer. The improvement comprises forming, on the electrical contacts, contact pads which have an upper surface devoid of a depressed center region. After the forming step, an adhering insulator material is deposited over the passivation layer, and a semiconductor wafer is mounted onto the substrate above the contact pads to form an assembly. The mounting process comprises applying pressure to the assembly and heating the assembly so that, prior to curing, adhering insulator material is squeezed out between the contact pads and a minimum thickness of material remains between the substrate and the wafer. The adhering insulator material is then allowed to cure. Portions of the wafer and adhering insulator material are then removed to expose the upper surface of predetermined contact pads. Predetermined regions of the remaining semiconductor wafer are then electrically interconnected with predetermined contact pads.

DETAILED DESCRIPTION OF THE PREFERRED EMBODIMENTS

Device Background

Figure 1:
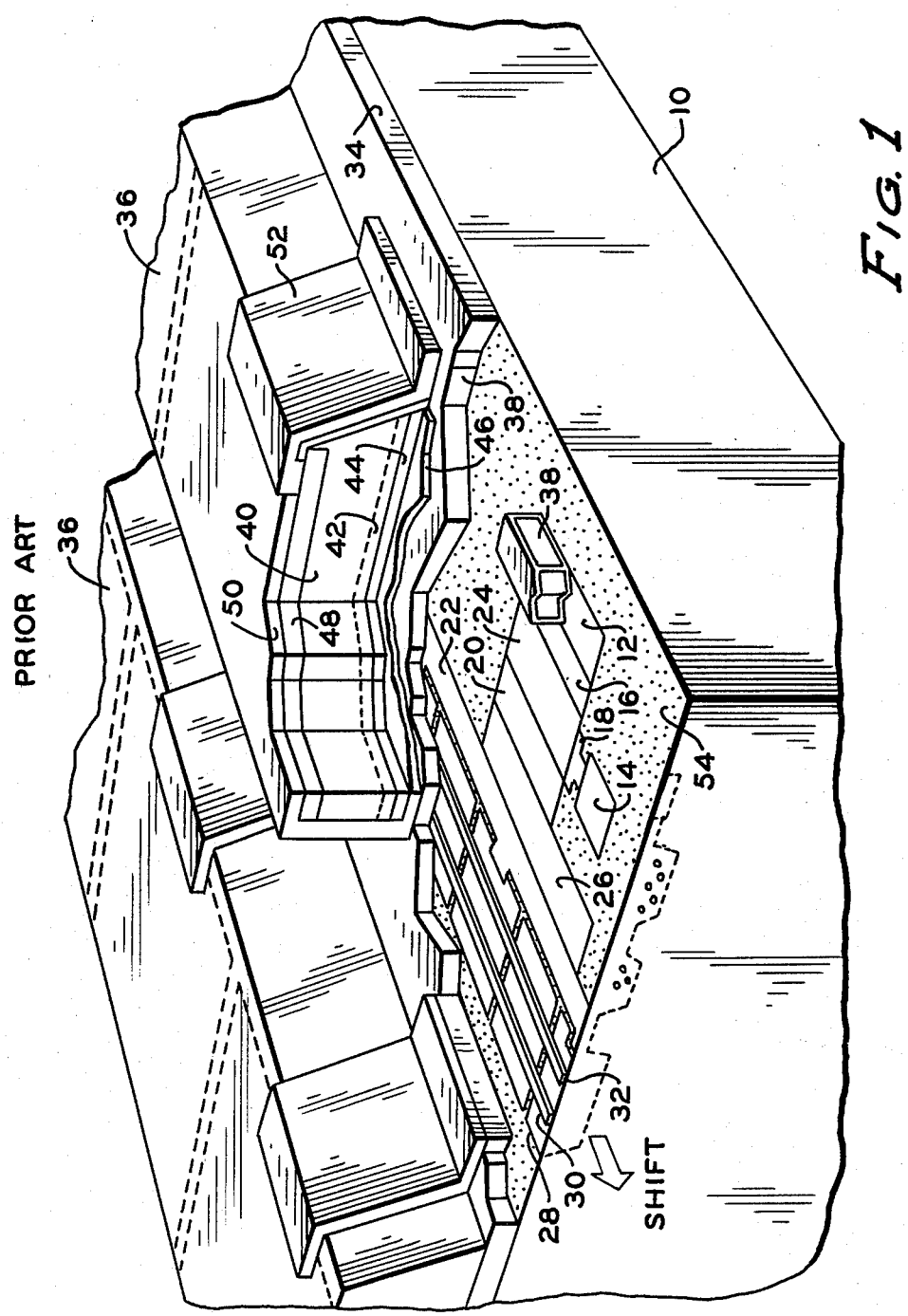
FIG. 1 shows a partial cut away view of one embodiment of an IR/CCD hybrid focal plane structure.

U.S. Pat. No. 4,196,508 discloses a hybrid mosaic IR/CCD focal plane structure fabricated on a silicon substrate. Such a device is illustrated in FIG. 1 which is essentially FIG. 1 from U.S. Pat. No. 4,196,508. The figure shows a hybrid focal plane in which a portion of the detector array has been removed to expose the internal structure of the focal plane including the CCD signal processing circuitry.

The IR/CCD hybrid focal plane shown in FIG. 1 includes a silicon substrate 10 in which the CCD signal processing circuitry is formed. The CCD signal processing circuitry is on or near the surface of the silicon substrate 10.

In the embodiment shown in FIG. 1, the CCD signal processing circuitry includes sources 12 and 14, gates 16, 18, 20 and 22, charge wells 24 and 26, shift register 28, and clock lines 30 and 32. Photosignals from a detector of the detector array are received at source 12. The signals are transferred from source 12 by gates 16, 20 and 22 through charge wells 24 and 26 to shift register 28. Clock lines 30 and 32 cause charge to be advanced through shift register 28 in the direction indicated by the arrow and the word "shift".

In the embodiment shown, the CCD signal processing circuitry is fully passivated by a standard silicon dioxide passivation layer 54 used with silicon integrated circuits.

In addition to the standard passivation on substrate 10, the structure shown comprises an insulator 34 which covers the standard passivation on the top surface of substrate 10 and provides a planar surface on which rows 36 of (Hg,Cd)Te detector material are formed. Electrical connections between the individual detector elements in rows 36 and the CCD circuitry are shown provided through contact pads 38. Contact pads 38 are metal pads which extend from sources 12 through insulator layer 34 and are exposed at the top surface of insulator 34. The spacing and size of contact pads 38 is consistent with the detector size and spacing in the hybrid structure.

In the structure shown in FIG. 1, the detector material includes a bulk p type body 40 of (Hg,Cd)Te. Near the back surface, a p+ type layer 42 is formed. A common electrical ohmic contact for all detectors in a row is provided by p+ layer 42 together with metal layer 44 and conductive epoxy layer 46.

Individual photovoltaic infrared detectors are formed in each row 36 by n+ regions 48 near the top surface of the detector material. The dashed lines shown on the top surfaces of rows 36 delineate the individual n+ regions 48. As shown in FIG. 1, n+ regions 48 are separated from one another, thereby forming individual photovoltaic detectors.

A passivation layer 50 covers the top and side surface of each row 36 of detector material. Photosignals from individual (Hg,Cd)Te photovoltaic detector elements are supplied to source elements 12 of the CCD signal processing circuitry by thin film interconnects 52 which electrically interconnect n+ regions 48 with corresponding contact pads 38. Thin film interconnects 52 are typically totally evaporated leads formed through processes available to those skilled in the art. As shown in FIG. 1, thin film interconnects 52 extend from contact pads 38 on the top surface of insulator 34, over the passivation layer 50 on a side surface of the detector, and up to the top surface of the detector. A hole in passivation layer 50 has been provided to allow each thin film interconnection 52 to make electrical contact to its corresponding n+ region 48.

Processing

Figure 2A:
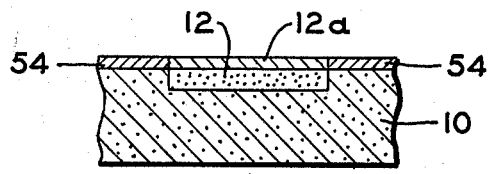
FIGS. 2a-2p facilitate processing discussions.

With the above device over-view as background, processing applicable to the present invention will now be discussed. FIGS. 2a–2p facilitates these discussions.

FIG. 2a illustrates a portion of semiconductor substrate 10 comprising a source diffusion 12. As discussed previously, photosignals from detector elements will be coupled to CCD processing circuitry in substrate 10 through source diffusions 12. The spacing and size of source diffusions 12 is consistent with detector size and spacing.

As is also shown in FIG. 2a, the top surface of semiconductor substrate 10 is passivated by passivation layer 54. Passivation layer 54 is a standard passivation layer utilized with silicon integrated circuits and is typically a thin film of silicon dioxide. Thin metal contacts 12a are exposed at the top surface of passivation layer 54. Contacts 12a allow external electrical contact to source regions 12.

Figure 2B:
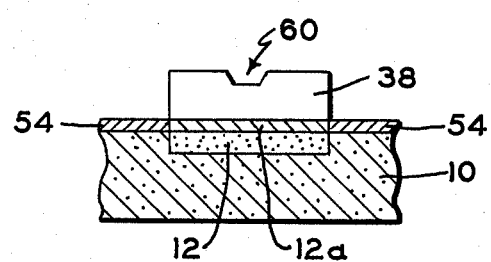

FIG. 2b illustrates a contact pad 38 which has been plated on top of a metal contact 12a, there typically being a contact pad 38 plated on top of each contact 12a. Contact pads 38 may be fabricated through sputtering and electroplating techniques as illustrated, for example, in U.S. Pat. No. 4,113,578 which is incorporated by reference herein. Preferred materials for contact pads 38 include gold and nickel which may be easily plated using standard plating techniques.

Contact pads fabricated through methods such as disclosed in U.S. Pat. No. 4,113,578 have an upper portion formed in what is essentially a dimple shape, the upper portion or surface of the pads having a depressed center region 60 as illustrated in FIG. 2b. Although not specifically addressed in U.S. Pat. No. 4,113,578, the dimple shape of contact pads 38 may arise at least in part because the electroplating process occurs not only over the area on which the contact pads are plated but also on the sides of the masks being used.

Figure 2C:
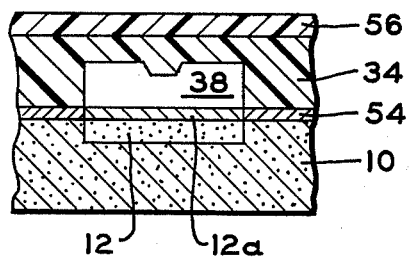

The next step in fabricating the device illustrated in FIG. 1 was previously to coat passivation layer 54 on the top surface of substrate 10 with a layer of an insulator to form insulator layer 34. Insulator layer 34 was formed by coating the top surface with a layer of adhering insulator material such as epoxy so that contact pads 38 were completely covered. The epoxy layer 34 was then allowed to cure, a thin, rigid temporary substrate 56 being pressed down over the epoxy layer 34 prior to curing in a preferred embodiment. The resulting assembly, comprising a contact pad as disclosed here, is illustrated in FIG. 2c.

Figure 2D:
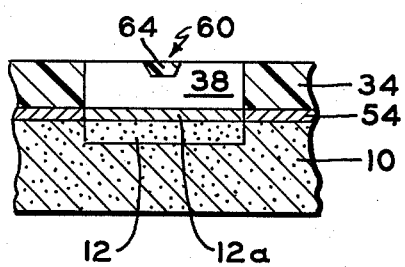

The assembly was then mounted on a lapping fixture, and temporary substrate 56 was lapped away. The lapping continued until enough epoxy in layer 34 was removed so that contact pads 38 were exposed. Assuming contact pads 38 having depressed center regions 60 were used, this process resulted in the configuration shown in FIG. 2d, depressed center region 60 being filled with trapped epoxy 64.

Figure 2E:
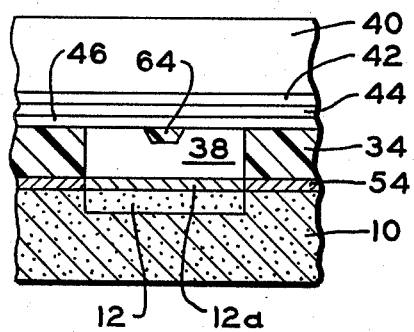

For the embodiment shown in FIG. 1 (see also FIG. 2e), a wafer 40 was prepared of p type (Hg,Cd)Te to include a p+ layer 42 and a thin film metal layer 44 which formed the (Hg,Cd)Te backside contact. The (Hg,Cd)Te wafer was then adhered, metal side down, to the top surface of insulator 34 with a material such as a thin conductive epoxy, thus forming a conductive epoxy layer 46. This assembly, comprising a contact pad 38 as disclosed here, is illustrated in FIG. 2e.

Figure 2F:
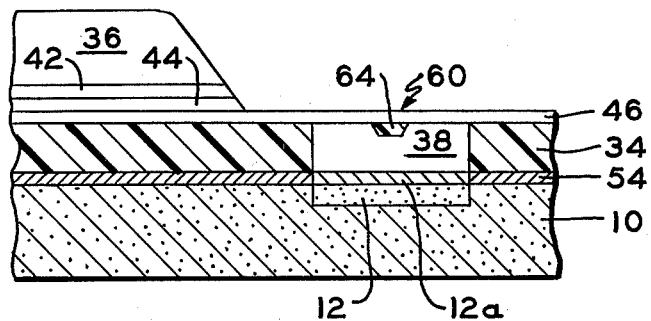

As is illustrated in FIG. 2f, (Hg,Cd)Te rows 36 were then spray-etch delineated so that rows 36 of rectangular shaped (Hg,Cd)Te bars were positioned above and between rows of plated contact pads 38 (see also FIG. 1). Note, however, that, as indicated in FIG. 2f, spray-etch delineation of (Hg,Cd)Te bars 36 leaves epoxy layer 46 above contact pads 38, epoxy layer 46 being impervious to the delineation process.

A low pressure air abrasion tool was then used to erode away the exposed portions of epoxy layer 46 to expose contact pads 38 embedded in insulating layer 34. While this air abrasion process of removing layer 46 sometimes provided satisfactory results if carefully done, the process has been found to require a very high degree of skill, and to be very difficult to control. As a result, damage to devices frequently occurred. Significant damage occurred to the (Hg,Cd)Te bars since the abrasive from the air abrasion tool flew in all directions as the abrasive eroded away above contact pads 38. Damage also frequently occurred to the CCD device through the abrasive penetrating epoxy layer 34 and entering the CCD circuitry within substrate 10. This process was further frustrated by the existence in each contact pad 38 of depressed center region 60 filled with trapped epoxy 64 which also required removal in order to make satisfactory contact with metallization layer 52 (FIG. 1).

In the fabrication of devices having 32 photodetectors coupled to 32 contact pads 38, the above process did result in getting some good devices. The percentage of good devices, however, was small.

Figure 2G:
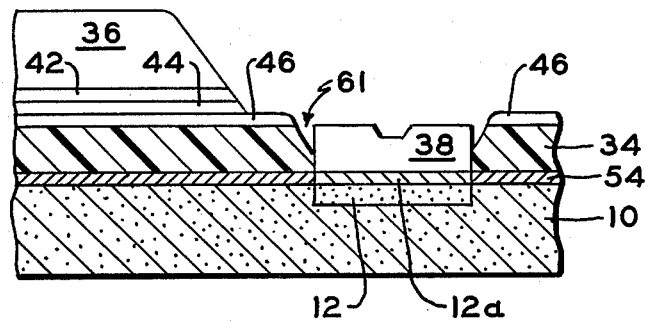

As a result of these problems, it was first determined that plasma etching could be used in lieu of the air abrasion tool to remove the epoxy for the purpose of exposing contact pads 38. Removal of the epoxy through plasma etching is accomplished through formation of a photoresist mask having holes above contact pads 38. The epoxy is then removed by plasma etching through the holes in the mask. This process, however, led to new problems since plasma etching will etch away photoresist as well as the epoxy, the photoresist being etched away at a much slower rate. Accordingly, with a relatively thick layer of epoxy 46 being present, the plasma etching process resulted in a deterioration of not only the epoxy layer 46 above each contact pad 38 but also of the photoresist mask around each hole on the mask. As a result, the epoxy 34 immediately surrounding each contact pad was also etched away. This resulted in a discontinuity 61 around each contact pad, as illustrated in FIG. 2g.

Discontinuity 61 in turn resulted in unreliable formation of contiguous thin film interconnects 52 between n+ regions 48 and contact pads 38 (see FIG. 1). Since thin film interconnects 52 are typically totally evaporated leads, they did not consistently support themselves across discontinuities 61, with the result that open circuits frequently occurred.

A new procedure was then developed whereby, rather than applying epoxy layer 34, allowing the epoxy to harden, and then lapping the epoxy until contact pads 38 are exposed as described above, it was determined that there is significant advantage to applying the epoxy and, prior to curing of the epoxy, immediately mounting wafer 40 onto the substrate above the contact pads. Pressure is then applied to the wafer and substrate assembly by means such as putting a weight on the wafer, and the assembly is heated by means such as an oven. In addition to helping to cure the epoxy, the heating initially causes the epoxy to be less viscous; placing the weighted assembly in an oven at 82 degrees centigrade for 16 hours has been found to be satisfactory. Through this process, by applying pressure to the assembly and heating the assembly, substantially all of the adhesive layer that previously formed between the wafer and contact pads 38 is eliminated. Virtual elimination of the epoxy layer above contact pads 38 is believed to result from this procedure since the epoxy can squeeze out between contact pads 38 rather than being trapped by the planar surface previously established in the prior art process by lapping the cured epoxy to the top of the contact pads. Stated another way, through the improved process, the (Hg,Cd)Te wafer is pushed down on many very small areas, those areas being the tops of the various contact pads 38, rather than being bonded down onto a uniform relatively large area established by lapping the cured epoxy. As a result, the improved process results in substantially less epoxy being trapped between the (Hg,Cd)Te wafer and the tops of the contact pads.

Figure 2H:
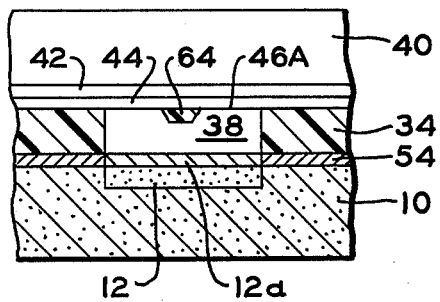

This new result is illustrated in FIG. 2h. Note that very thin adhesive layer 46A now exists only over each contact pad 38 since layer 46A is now comprised of the same dielectric epoxy as layer 34.

Figure 2I:
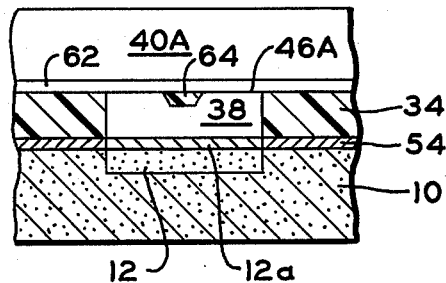
Figure 2J:
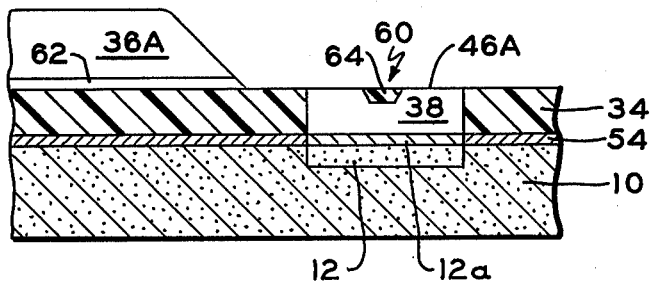

FIG. 2i illustrates an alternate preferred (Hg,Cd)Te wafer 40a. Rather than forming a p+ type layer 42 in the wafer and providing metal layer 44, the back surface of wafer 40A is prepared by lapping, chemically polishing, and then applying an insulation layer 62 such as zinc sulfide. Neither wafer 40 or 40A is preferred over the other, and either wafer is compatible with the present invention. Obviously, wafers other than those disclosed are also compatible with the present invention.

Whatever wafer is used, for contact pads which are devoid of a depressed center region 60, the previously discussed method is sufficient to eliminate the creation of undesirable discontinuities 61 since very thin layer 46A is easily removed through plasma etching without damage to the photoresist mask. However, for contact pads 38 comprising a depressed center region 60, one is still faced with the problem of removing trapped epoxy 64 from depressed center region 60 in order to establish reliable contact between each contact pad 38 and its corresponding thin film interconnect 52.

Figure 2K:
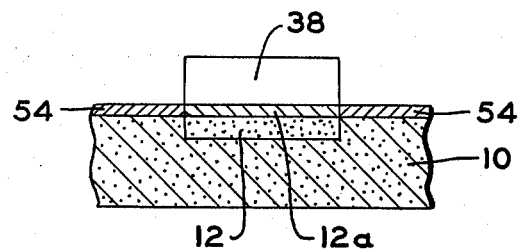

Accordingly, a new procedure was developed whereby depressed center region 60 is removed prior to applying epoxy 34. Removing depressed center region 60 may be accomplished through lapping, a process which results in each contact pad 38 having an upper portion which is completely flat. Preferably, all contact pads on a device are lapped to the same height so that a plane is defined by the tops of all contact pads 38 on the device. After lapping, contact pads 38 preferably have a thickness of between about five and about 15 microns. FIG. 2k illustrates a contact pad with depressed center region 60 removed by lapping.

Figure 2M:
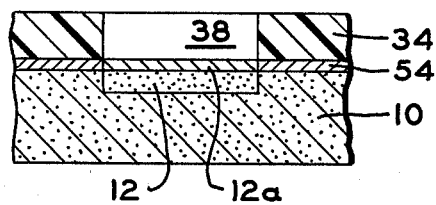
Figure 2N:
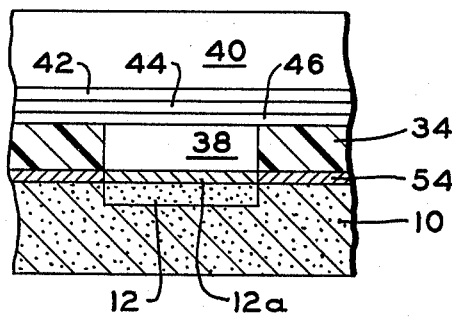

It might seem apparent that one could have eliminated the problems solved by the present invention through continued lapping in the prior art process in order to not only expose contact pads 38 (FIG. 2d), but to also remove depressed center region 60 and, therefore trapped epoxy 64. Thus, it might seem apparent that one could lap the structure shown in FIGS. 2c and 2d until all trapped epoxy 64 was removed, resulting in a structure as shown in FIG. 2m. However, such an approach still results in the same relatively thick epoxy layer 46 (FIG. 2n) which is apparently trapped by the planar surface established by lapping the cured epoxy and contact pads. The plasma etching process of removing layer 46 then results in the same previously discussed deterioration of not only layer 46 but also of the photoresist mask around each contact pad. As a result, the epoxy layer 34 immediately surrounding each contact pad is also etched away, leaving discontinuities 61 (FIG. 2g) and making unreliable the formation of contiguous thin film interconnects 52, as previously discussed.

Figure 2O:
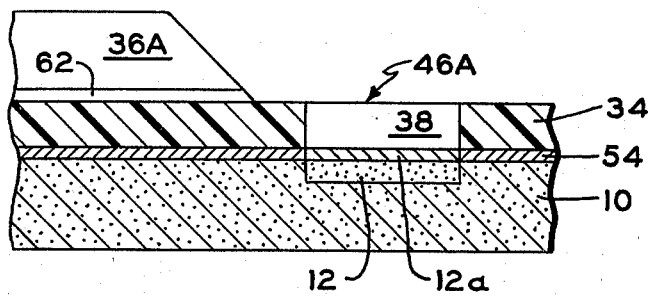
Figure 2P:
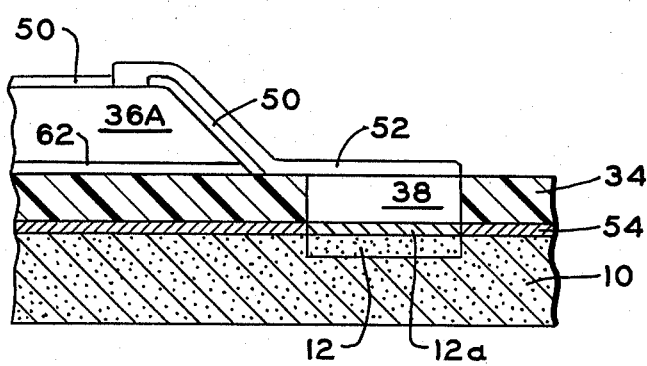

Accordingly, through the present invention, a highly improved result is obtained by bonding down the (Hg,Cd)Te wafer prior to epoxy layer 34 becoming cured and, if contact pads having a depressed center region 60 are employed, removing region 60 prior to the bonding process. In this manner, after delineation of each row of detector elements, the only residual epoxy requiring removal is very thin layer 46A above each contact pad. See FIG. 2o. Since layer 46A is very thin, it is readily removed by plasma etching without the previously discussed problems of damaging the photoresist mask and epoxy layer 34 around each contact pad. Further, since each contact pad is free of the epoxy-filled depressed center region, a clean conductive surface on the top of each contact pad 38 is readily available for connection to thin film interconnects 52, as shown in FIG. 2p.

Although the present invention has been described in the context of particular IR/CCD focal plane structures, such structures are not to be taken as limiting the present invention, which is defined by the claims following below. It should also be recognized that others skilled in the art may devise processes that vary from those described above but that are still within the limits of the claims.

The embodiments of the invention on which an exclusive property or right is claimed are defined as follows:

1. An improved method of providing a semiconductor device having a semiconductor substrate containing solid state signal processing circuitry, the solid state signal processing circuitry comprising doped regions of predetermined resistivity within the semiconductor substrate, there being a passivation layer covering a surface of the semiconductor substrate but with electrical contacts to the solid state signal processing circuitry exposed through the passivation layer, the improvement comprising:

forming, on the electrical contacts, contact pads which have an upper surface devoid of a depressed center region, the contact pads extending above the passivation layer, there being free space between the contact pads above the passivation layer;

after the forming step, depositing an adhering insulator material of the type which is applied in substantially uncured form, the substantially uncured adhering insulator material being deposited so that the substantially uncured adhering insulator material substantially covers the contact pads and substantially fills the free space between the contact pads above the passivation layer;

mounting a semiconductor wafer onto the substrate above the contact pads to form an assembly;

applying pressure and heat to the assembly so that, prior to curing, adhering insulator material is squeezed out between the contact pads and a minimum thickness of adhering insulator material remains between the upper surface of the contact pads and the wafer;

allowing the adhering insulator material to cure;

removing portions of the wafer and adhering insulator material to expose the upper surface of predetermined contact pads; and electrically interconnecting predetermined regions of the remaining semiconductor wafer with predetermined contact pads.

2. The method of claim 1 wherein the forming step comprises:

forming contact pads through a process which may result in the upper surface of the contact pads having a depressed center region; and reconfiguring the contact pads to eliminate the depressed center regions.

3. The method of claim 2 wherein the step of removing the depressed center region comprises the process of lapping.

4. The method of claim 1 wherein, after the forming step, the contact pads extend above the passivation layer by beteen about 5 microns and about 15 microns.

5. The method of claim 1 wherein the adhering insulator material is a nonconductive epoxy.

6. The method of claim 1 wherein the contact pads are of a metal of the group consisting of gold and nickel.

7. The method of claim 1 wherein the step of forming contact pads comprises the process of electroplating.

8. The method of claim 1 wherein the step of removing portions of the adhering insulator material comprises the process of plasma etching.

* * * * *